(12) United States Patent
Kim et al.

(10) Patent No.: US 8,395,245 B2
(45) Date of Patent: Mar. 12, 2013

(54) SEMICONDUCTOR PACKAGE MODULE

(75) Inventors: Jong Hoon Kim, Gyeonggi-do (KR); Min Suk Suh, Seoul (KR); Seong Cheol Kim, Gyeongsangnam-do (KR); Seung Taek Yang, Seoul (KR); Seung Hyun Lee, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 13 days.

(21) Appl. No.: 11/953,967

(22) Filed: Dec. 11, 2007

(65) Prior Publication Data
US 2009/0121326 A1 May 14, 2009

(30) Foreign Application Priority Data
Nov. 9, 2007 (KR) .................. 10-2007-0114268

(51) Int. Cl.
*H01L 23/495* (2006.01)
(52) U.S. Cl. ........ 257/666; 257/678; 257/668; 257/724; 257/738; 257/777; 257/E23.004; 257/E23.069; 257/E25.023; 365/63
(58) Field of Classification Search .................. 257/678, 257/668, 724, 738, 777, E23.004, E23.069, 257/E25.023; 365/63
See application file for complete search history.

(56) References Cited

U.S. PATENT DOCUMENTS

| | | | | |
|---|---|---|---|---|
| 5,291,062 A | * | 3/1994 | Higgins, III | 257/698 |
| 5,719,745 A | * | 2/1998 | Agonafer et al. | 361/704 |
| 5,840,417 A | * | 11/1998 | Bolger | 428/323 |
| 5,875,097 A | * | 2/1999 | Amaro et al. | 361/704 |
| 6,075,710 A | * | 6/2000 | Lau | 361/760 |
| 7,081,373 B2 | | 7/2006 | Roeters et al. | |
| 2001/0000053 A1 | * | 3/2001 | Suh et al. | 257/686 |
| 2002/0053723 A1 | * | 5/2002 | Matsuura | 257/678 |
| 2002/0158318 A1 | * | 10/2002 | Chen | 257/678 |
| 2008/0067673 A1 | * | 3/2008 | Takamatsu et al. | 257/712 |

FOREIGN PATENT DOCUMENTS

| | | |
|---|---|---|
| CN | 1574302 A | 2/2005 |
| JP | 05-037121 A | 2/1993 |
| JP | 06-079990 A | 3/1994 |
| JP | 07-283338 A | 10/1995 |
| JP | 08-124967 A | 5/1996 |
| JP | 11-111914 A | 4/1999 |
| JP | 11-150214 A | 6/1999 |
| JP | 11-168157 A | 6/1999 |
| JP | 2002-110901 A | 4/2002 |
| JP | 2002-151648 A | 5/2002 |
| JP | 2003-068956 A | 3/2003 |
| JP | 2004-023084 A | 1/2004 |

(Continued)

*Primary Examiner* — Matthew Reames
*Assistant Examiner* — Ermias Woldegeorgis
(74) *Attorney, Agent, or Firm* — Ladas & Parry LLP

(57) ABSTRACT

A semiconductor package module includes a circuit board including a board body having a receiving portion and conductive patterns formed on the board body; a semiconductor package received in the receiving portion and having conductive terminals electrically connected to the conductive patterns and an s semiconductor chip electrically connected to the conductive terminals; and a connection member electrically connecting the conductive patterns and the conductive terminals. In the present invention, after a receiving portion having a receiving space is formed in the board body of a circuit board and a semiconductor package is received in the receiving portion, and a connection terminal of the semiconductor package and a conductive pattern of the board body are electrically connected using a connection member, a plurality of semiconductor packages can be stacked in a single circuit board without increasing the thickness thereby significantly improving data storage capacity and data processing speed of the semiconductor package module.

18 Claims, 8 Drawing Sheets

FOREIGN PATENT DOCUMENTS

| | | | | | | |
|---|---|---|---|---|---|---|
| JP | 2004-519843 A | 7/2004 | KR | 1020010061794 | | 7/2001 |
| JP | 2004-247724 A | 9/2004 | KR | 1020020076441 A | | 10/2002 |
| KR | 2001061794 A | * 7/2001 | WO | 02/34021 A2 | | 4/2002 |

* cited by examiner

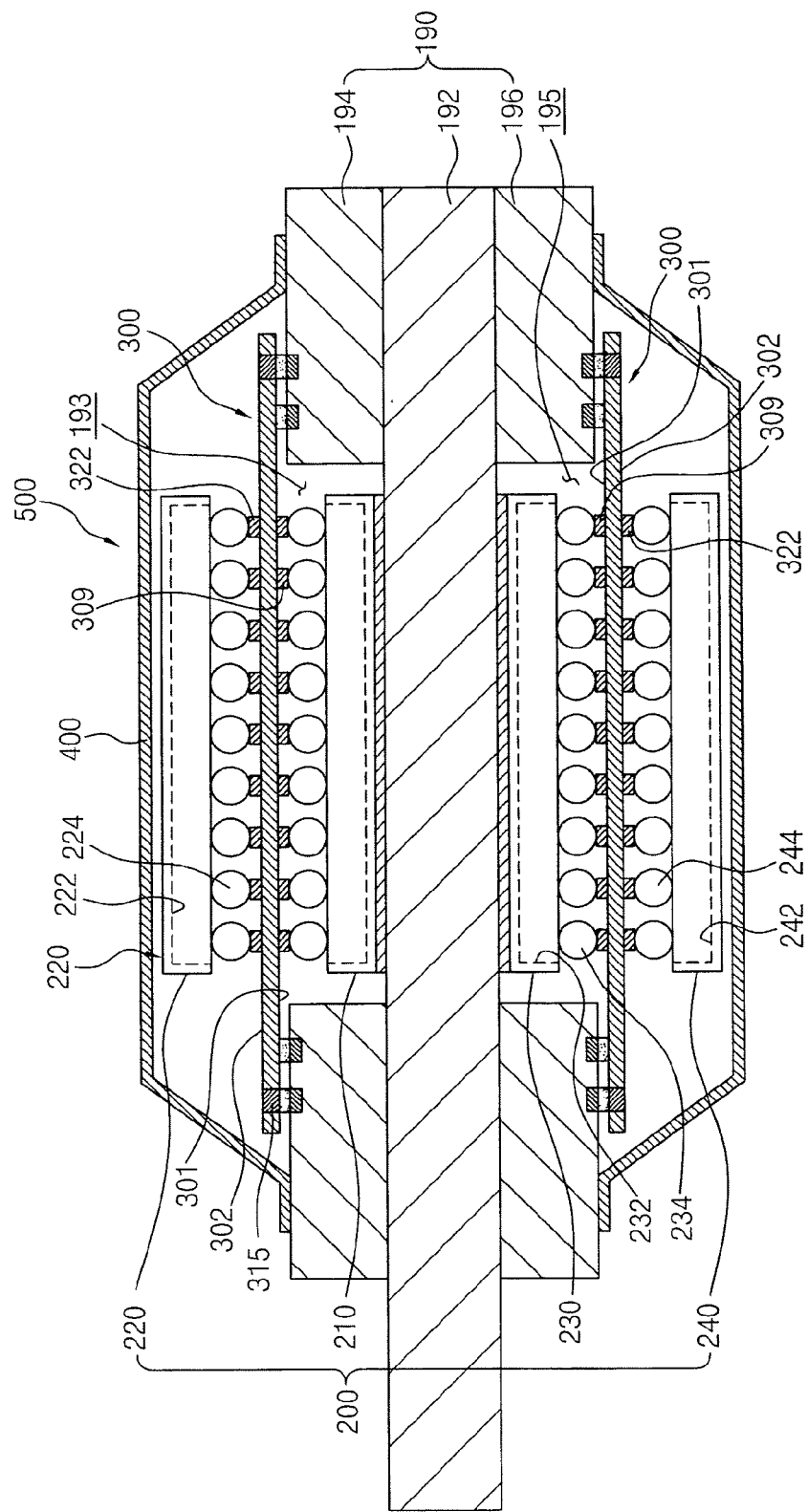

SEMICONDUCTOR PACKAGE MODULE

CROSS-REFERENCE TO RELATED APPLICATIONS

The present application claims priority to Korean patent application number 10-2007-0114268 filed on Nov. 9, 2007, which is incorporated herein by reference in its entirety.

BACKGROUND OF THE INVENTION

The present invention relates to a semiconductor package module.

Recent technology development of the semiconductor packages provides ways of storing and processing more massive amounts of data in a relatively shorter amount of time.

Further, the semiconductor packages mounted over a printed circuit board are utilized in fabricating semiconductor package modules, that are configurable to be coupled with various devices such as a computer to carry out various intended functions.

Recent research trend focuses on finding better ways to package more number of semiconductor packages into a semiconductor package module with reduced volume size.

SUMMARY OF THE INVENTION

Embodiments of the present invention are directed to a semiconductor package module with enhanced storing capacity and data processing speed and reduced volume.

In one embodiment, a semiconductor package module comprises a circuit board including a board body having a receiving portion and conductive patterns formed in the board body; a semiconductor package received in the receiving portion and having conductive terminals electrically connected to the conductive patterns and an s semiconductor chip electrically connected to the conductive terminals; and a connection member electrically connecting the conductive patterns and the conductive terminals.

The receiving portion is a concave recess formed on the surface of the board body.

The conductive terminal and the surface of the board body are disposed in the same plane.

The semiconductor package includes a molding member, attached to the lower surface of the receiving portion via adhesive, for molding the semiconductor chip.

The receiving portion is located over the first surface of the board body and the second surface opposite of the first surface.

The connection member includes an insulation member and a first conductive pattern formed on the lower surface of the insulation member opposite of the lower surface of the receiving portion and electrically connected to the conductive pattern.

The insulation member includes a flexible board.

The insulation member is located on the upper surface, opposite of the lower surface, and further includes a second connection pattern electrically connected to the conductive pattern.

The semiconductor package module may further comprise an additional semiconductor package electrically connected to the second connection pattern.

The insulation member includes a conductive pathway passing through the insulation member electrically connecting the second connection pattern and the conductive pattern.

The conductive pattern and the first connection pattern and the conductive pattern and the second connection pattern are electrically connected by a solder or an anisotropic conductive film (ACF).

The receiving portion is a through hole passing through the board body.

The semiconductor package module may further comprise an external heat dissipating cover coupled to the board body and covering the receiving portion.

The board body includes a heat radiating plate located within the board body which facilitates the dissipation of heat generated by the semiconductor package to the outside.

Some portion of the heat radiating plate is projected from the board body and the projected portion of the heat radiating plate includes a plurality of heat dissipation fins.

A heat conductive adhesive is interposed between the semiconductor package and the heat radiating plate.

The board body includes a plate-shaped first board body and second board bodies disposed at both sides of the first board body and having a through portion which exposes the first board body in order to form the receiving portion; and the conductive patterns located on the surface of the second board bodies respectively.

The first board body has a first length and the second board body has a second length shorter than the first length.

The semiconductor package module may further comprise a molding member for molding the semiconductor package and the connection member.

The connection member includes a lead frame.

BRIEF DESCRIPTION OF THE DRAWINGS

FIG. 9 is a sectional view illustrating a semiconductor package module in accordance with yet a further embodiment of the present invention.

DESCRIPTION OF SPECIFIC EMBODIMENTS

Figure 1:
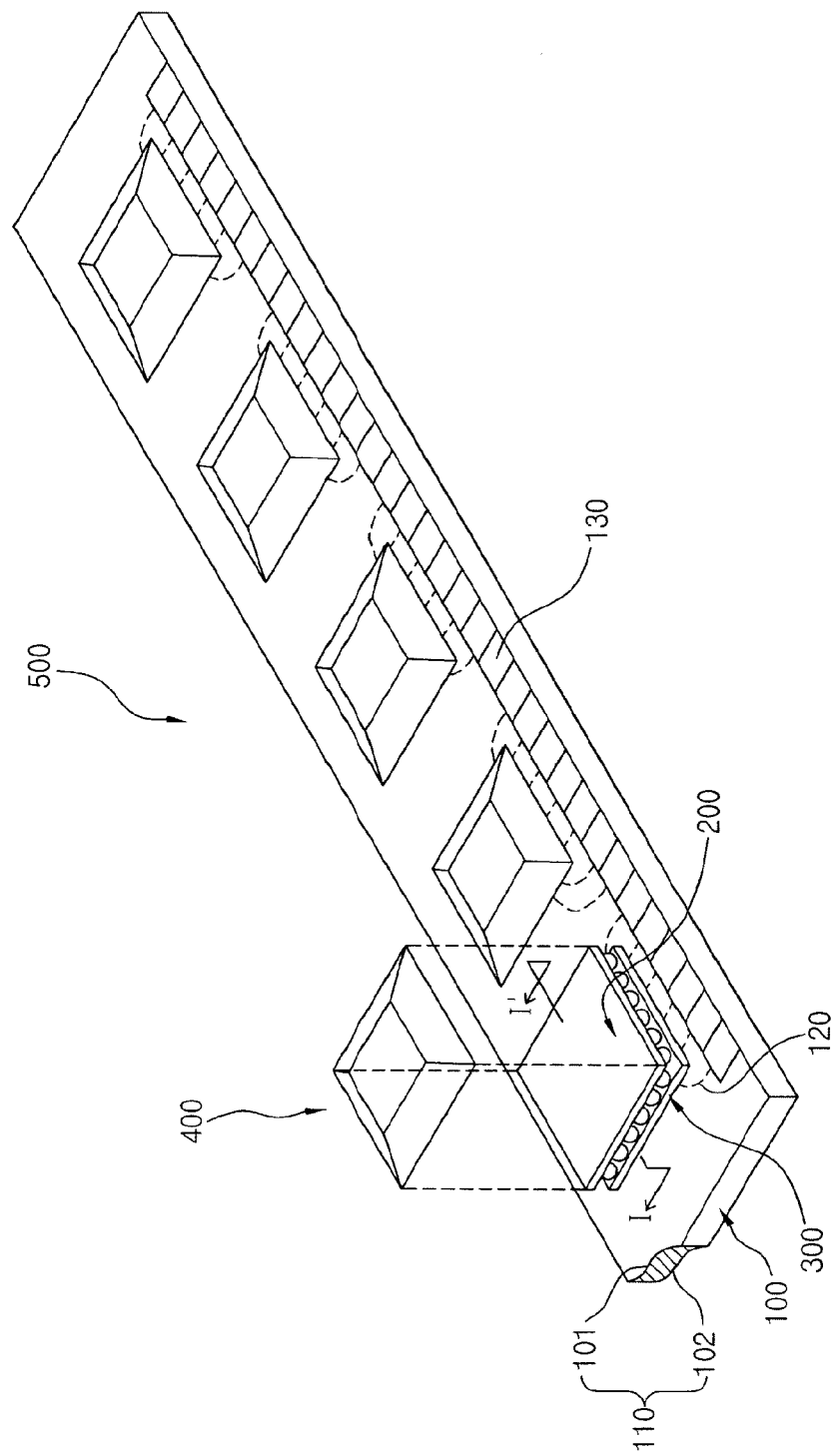
FIG. 1 is a perspective view illustrating a semiconductor package module in accordance with an embodiment of the present invention.
Figure 2:
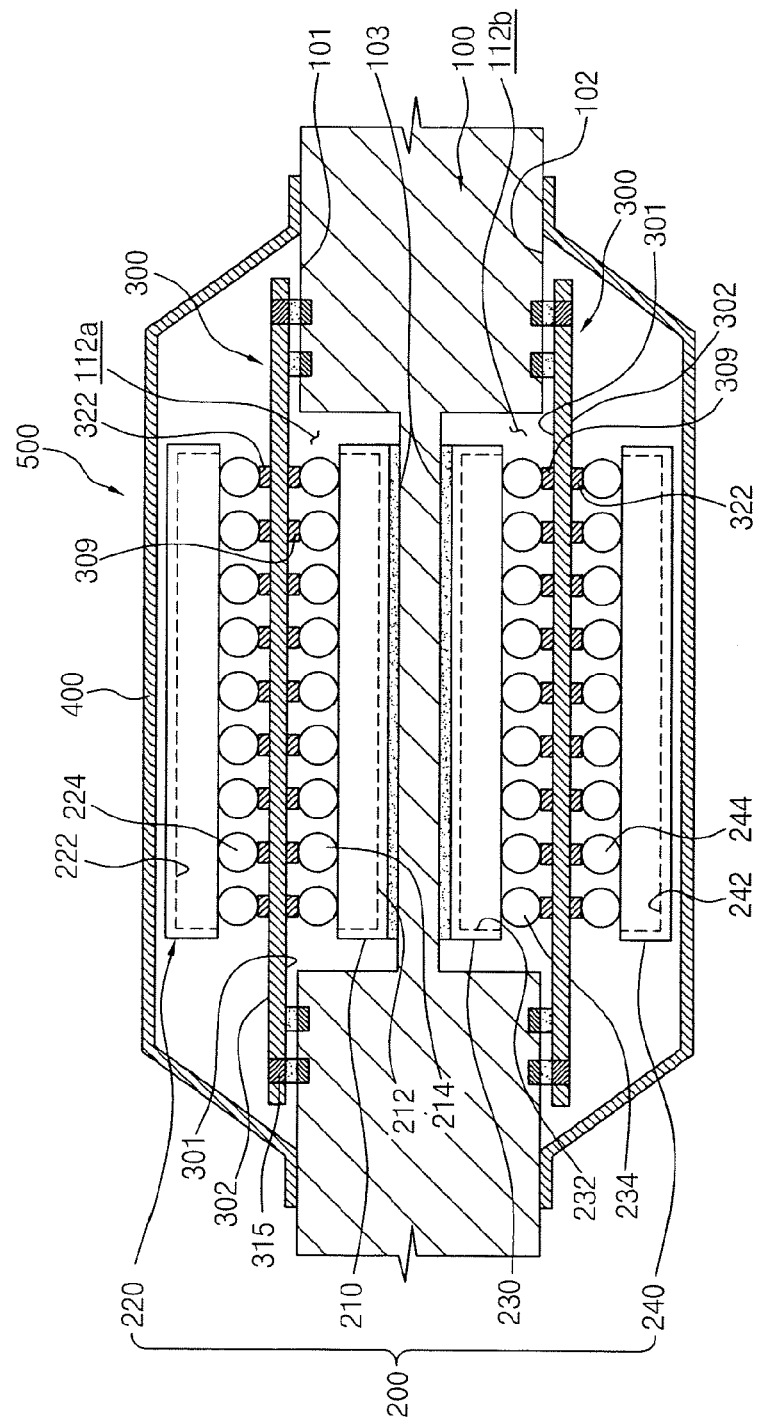
FIG. 2 is a cross-sectional view taken along the line I-I' shown in FIG. 1.

FIG. 1 is a perspective view illustrating a semiconductor package module in accordance with an embodiment of the present invention. FIG. 2 is a cross-sectional view taken along the line I-I' in FIG. 1.

Referring to FIGS. 1 and 2, the semiconductor package module 500 includes a circuit board 100, a semiconductor package 200 and a connection member 300. In addition, the semiconductor package module 500 may further include a heat dissipating member 400.

Figure 3:
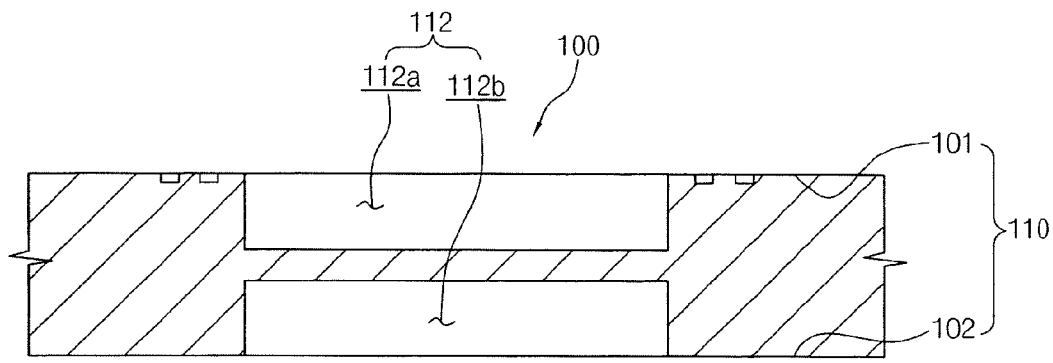
FIG. 3 is a cross-sectional view illustrating a circuit board in accordance with an embodiment of the present invention as shown in FIG. 1.

FIG. 3 is a cross-sectional view illustrating a circuit board according to an embodiment of the present invention as shown in FIG. 1.

Referring to FIGS. 1 and 3, the circuit board 100 includes a board body 110 and a conductive pattern 120. In an embodiment of the present invention, the circuit board 100 may be a printed circuit board.

The board body 110 is, for example, shaped in a rectangular parallelepiped plate manner. Alternatively, the board body 110 may be shaped in various manners other than the rectangular parallelepiped plate manner.

The board body 110 has a first surface 101 and a second surface 102 opposite of the first surface 101 and a receiving portion 112 providing a receiving space formed on the first surface 101 and/or the second surface 102.

The receiving portion 112 is a concave recess formed on the first surface 101 and/or the second surface 102.

In an embodiment of the present invention, the reference number 112a refers to the receiving portion formed on the first surface 101 of the board body 110 and the reference number 112b refers to the receiving portion formed on the second surface 102 of the board body 110.

The first end portion of the conductive pattern 120 shown in FIG. 1 is arranged along the periphery of the receiving part of the board body 110 and the second end portion opposite of the first end portion is electrically connected to an input/output terminal 130 arranged along a longitudinal side of the board body 110.

Figure 4:
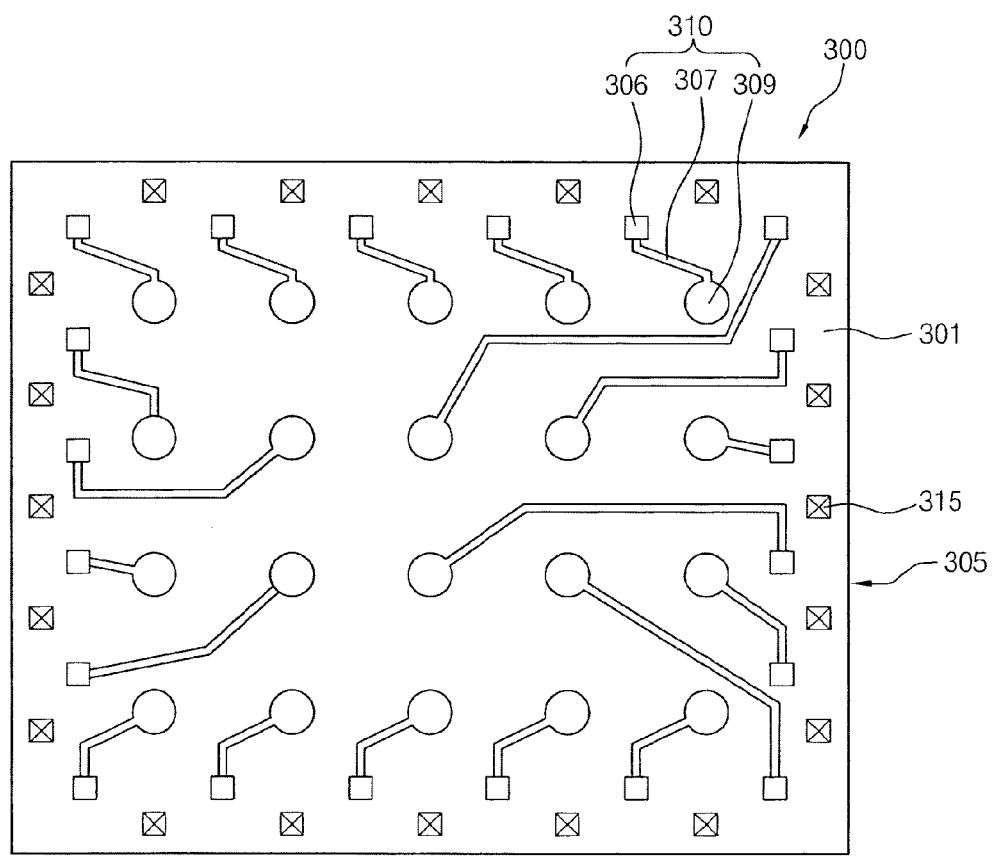
FIG. 4 is a bottom view illustrating a lower surface of a connection member in accordance with an embodiment of the present invention as shown in FIG. 2.

FIG. 4 is a bottom view illustrating the lower surface of the connection member 300 shown in FIG. 2.

Referring to FIGS. 2 and 4, the connection member 300 covers each receiving part 112 (112a, 112b). The connection member 300 covering the receiving part 112 includes an insulation member 305 and a first connection pattern 310.

The insulation member 305 may be a thin, flexible synthetic resin sheet. Alternatively, the insulation member 305 may be a synthetic resin plate having a relatively high strength.

As shown in FIG. 4, the insulation member 305 has a lower surface 301 facing the lower surface 103 of the board body 110 formed by the receiving area 112 (112a, 112b) and an upper surface 203 opposite of the lower surface 301.

The first connection pattern 310 is located on the lower surface 301 of the insulation member 305. The first connection pattern 310 includes a first connection terminal 306, a first conductive pattern 307 and a first ball land pattern 309.

The first connection terminal 306 corresponds to an end portion of each conductive pattern 120 formed on the first surface 101 of the board body 110 of the circuit board 100.

The first ball land pattern 309 is, for example, disc-shaped and is located on the lower surface 301 of the connection member 300.

The first conductive pattern 307 electrically connects the first connection terminal 306 and the corresponding first ball land pattern 309. Reference number 315 shown in FIG. 4 indicates a conductive via electrically connected to the second connection pattern 320.

The first connection terminal 306 shown in FIG. 4 is electrically connected to an end portion of the conductive pattern 120 shown in FIG. 1 by a solder or, alternatively, an anisotropic conductive film (ACF)

Figure 5:
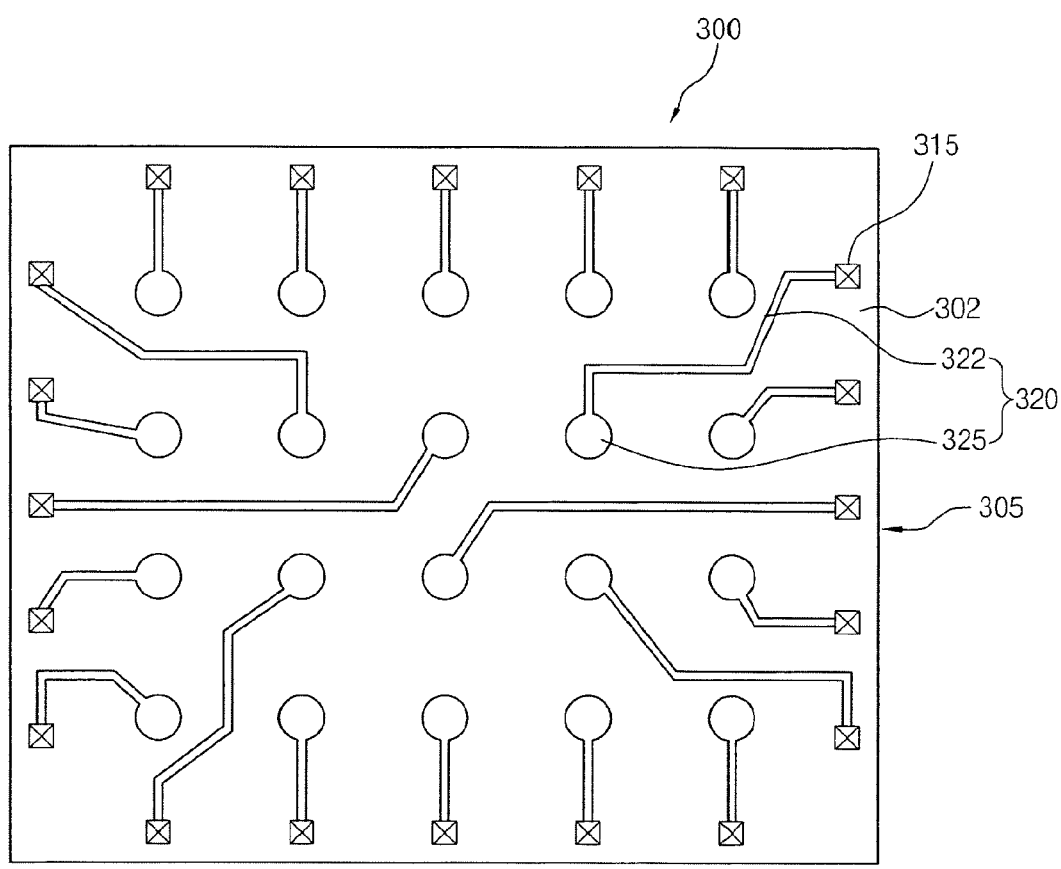
FIG. 5 is a plan view illustrating an upper surface of the connection member in accordance with an embodiment of the present invention as shown in FIG. 2.

FIG. 5 is a plan view illustrating the upper surface of the connection member shown in FIG. 2.

Referring to FIGS. 2 and 5, a conductive via 315 and the second conductive pattern 320 are disposed over the upper surface 302 of the connection member 300.

The conductive via 315 is formed within a through hole passing through the upper surface 302 and the lower surface 301 of the connection member 300. The conductive via 315 is electrically connected to the conductive pattern 120 of the board body 110.

The second conductive pattern 320 includes a second conductive pattern 322 and a second ball land pattern 325.

The second ball land pattern 325 is, for example, disc-shaped, and the second ball land pattern 325 is in a matrix-form and located on the upper surface 302 of the insulation member 305.

The second conductive pattern 322 electrically connects the conductive via 315 and the second ball land pattern 325.

The conductive via 315 shown in FIG. 5 is electrically connected to an end portion of the conductive pattern 120 shown in FIG. 1 by a solder or, alternatively, an anisotropic conductive film (ACF).

Referring again to FIG. 2, the semiconductor package 200 may be located on the lower surface 301 and/or the upper surface 302 of the connection member 300.

In the present embodiment, the receiving part 112 (112a, 112b) is respectively formed on the first surface 101 and the second surface 102 of the board body 110 and the connection member 300 is therefore respectively disposed in the receiving part 112a formed on the first surface 101 of the board body 110 and the receiving part 112b formed in the second surface 102 of the board body 110.

Hereafter, the semiconductor packages 200 respectively located on the lower surface 302 and the upper surface 301 of the connection member 300 disposed in the receiving part 112a formed on the first surface 101 of the board body 110 is defined as a first semiconductor package 210 and a second semiconductor package 220.

Also, the semiconductor packages 200 respectively located on the lower surface 301 and the upper surface 302 of the connection member 300 disposed in the receiving part 112b formed on the second surface 102 of the board body 110 is defined as a third semiconductor package 230 and a fourth semiconductor package 240.

The first semiconductor package 210 is received in the receiving part 112a formed on the first surface 101 of the board body 110.

The first semiconductor package 210 includes a first semiconductor chip 212 and a first connection terminal 214 electrically connected to the first semiconductor chip 212. The first connection terminal 214 may be, for example, a conductive bump or a solder ball.

The first semiconductor chip 212 of the first semiconductor package 210 may further include a molding member and is located on the lower surface 103 of the board body 110 formed by the receiving part 112a. The first semiconductor chip 212 is adhered to the lower surface 103 by an adhesive.

The first connection terminal 214 is electrically connected to the first ball land pattern 309 formed on the lower surface 301 of the connection member 300 located on the first surface 101 of the board body 110. In order to realize this, an end of the first connection terminal 214 is disposed over substantially the same plane as the first surface 101 of the board body 110.

The second semiconductor package 220 includes a second semiconductor chip 222 and a second connection terminal 224 electrically connected to the second semiconductor chip 222. The second connection terminal 224 may be, for example, a conductive bump or a solder ball.

The second semiconductor chip 222 of the second semiconductor package 220 may further include a molding member.

The second connection terminal 224 is electrically connected to the second ball land pattern 325 formed on the upper surface 302 of the connection member 300 disposed on the first surface 101 of the board body 110.

The third semiconductor package 230 is received in the receiving part 112b formed in the second surface 102 of the board body 110.

The third semiconductor package 230 includes a third semiconductor chip 232 and a third connection terminal 234 electrically connected to the third semiconductor chip 232. The third connection terminal 234 may be, for example, a conductive bump or a solder ball.

The third semiconductor chip 232 of the third semiconductor package 230 may further include a molding member and is disposed over the lower surface 103 of the board body 110 formed by the receiving part 112b. The third semiconductor chip 232 is adhered to the lower surface 103 by an adhesive.

The third connection terminal 234 is electrically connected to the first ball land pattern 309 formed on the lower surface 301 of the connection member 300 disposed over the second surface 102 of the board body 110. In order to facilitate this, an end of the third connection terminal 234 is disposed over substantially the same plane as the second surface 102 of the board body 110.

The fourth semiconductor package 240 includes a fourth semiconductor chip 242 and a fourth connection terminal 244 electrically connected to the fourth semiconductor chip 242. The fourth connection terminal 244 may be, for example, a conductive bump or a solder ball.

The fourth semiconductor chip 242 of the fourth semiconductor package 240 may further include a molding member.

The fourth connection terminal 244 is electrically connected to the second ball land pattern 325 formed on the upper surface 302 of the connection member 300 disposed over the second surface 102 of the board body 110.

Meanwhile, when the plurality of the semiconductor packages 200 connected by the connection member 300 are disposed within the receiving part 112 (112a, 112b) of the board body 110 of the circuit board 100, the semiconductor packages 200 generate a large amount of heat which cannot easily dissipate and which thereby impedes the performance of the semiconductor packages.

In the present embodiment, the semiconductor package module 500 may include the heat dissipating member 400 in order to easily discharge the generated heat from the semiconductor packages 200 disposed within the receiving part 112.

The heat dissipating member 400 may be, for example, cap shaped and covers each semiconductor package 200 formed in the board body 110 of the circuit board 100. The cap shaped heat dissipating member 400 discharges the heat generated by the semiconductor packages 200 thereby preventing the heat's negative impact on the performance of the semiconductor packages 200.

Examples of proper metals for use as the heat dissipating member 400 include aluminum, aluminum alloy, copper, copper alloy and silver.

Alternatively, the heat dissipating member 400 may include an electromagnetic wave absorbing material which absorbs, reflects or transforms to thermal energy a large amount of the electromagnetic waves generated by the semiconductor packages 200, thereby limiting the generation of electromagnetic waves from the semiconductor package module 500.

Figure 6:
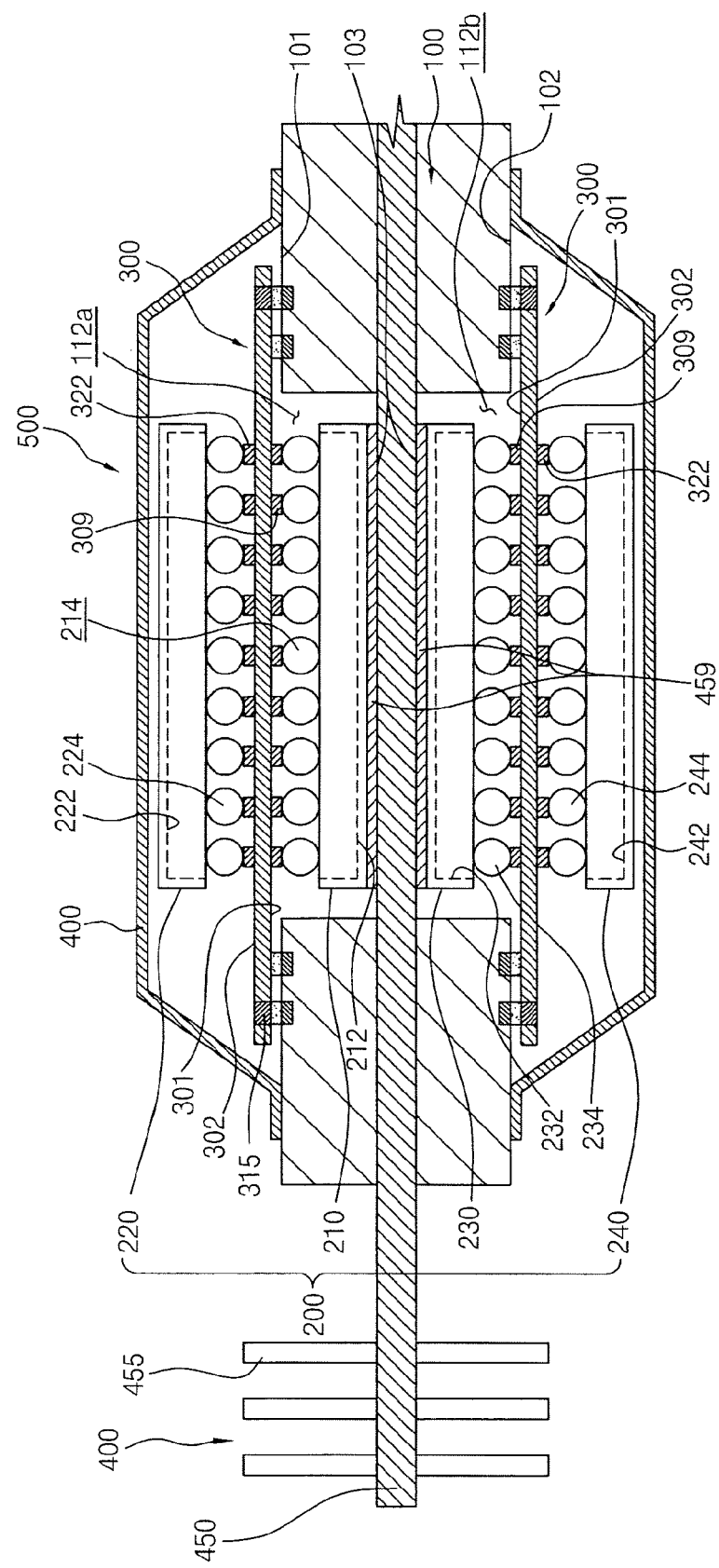
FIG. 6 is a cross-sectional view illustrating a semiconductor package module in accordance with another embodiment of the present invention.

FIG. 6 is a cross-sectional view illustrating a semiconductor package module in accordance with another embodiment of the present invention. The semiconductor package module in accordance with another embodiment of the present invention has substantially the same components as the semiconductor package module described with reference to FIG. 2 with the addition of the heat dissipating member 400. Therefore, identical parts are denoted by the same reference numbers and a description thereof will not be repeated.

Referring to FIG. 6, the semiconductor package module 500 includes the circuit board 100, the semiconductor package 200, the connection member 300 and a heat radiating plate 450.

The heat radiating plate 450 which acts as a core is disposed within the circuit board 100 having a rectangular parallelepiped plate shape. In the present embodiment, the heat radiating plate 450 may have a rectangular parallelepiped plate shape like the circuit board 100.

Example of material usable as the heat radiating plate 450 include aluminum, aluminum alloy, copper and copper alloy, which have a high thermal conductivity.

The first semiconductor package 210 and the third semiconductor package 230 of the semiconductor package 200 are in close contact with the heat radiating plate 450. At this time, in order to quickly transfer the heat generated by the first semiconductor package 210 and the third semiconductor package 230 to the heat radiating plate 450, a thermal conductive adhesive 459 is disposed between the heat radiating plate 450 and the first semiconductor package 210 and the heat radiating plate 450 and the third semiconductor package 230. The thermal conductive adhesive 459 may include, for example, a metal powder having a high thermal conductivity.

Meanwhile, some portion of the heat radiating plate 450 may project from the board body 110 in order to increase the radiating area. Particularly, the heat radiating plate 450 may project from a first end portion opposing to a second end portion of the board body 110 formed with the input/output terminal 130.

Meanwhile, in order to enhance the heat radiating performance, a heat dissipation fin 455 may be formed at the heat radiating plate 450 projected from the board body 110. A plurality of the heat dissipation fins 455 may be arranged in a direction perpendicular to the heat radiating plate 450. In order to increase the radiating area, the heat dissipation fin 455 may have a plate shaped. In addition, the heat dissipation fin 455 may have a plurality of grooves or projections for increasing the surface area of the heat dissipation fin 455.

In the present embodiment, the heat dissipation fin 455 may be formed integrally with the heat radiating plate 450. Alternatively, the heat dissipation fin 455 may be formed separately from the heat radiating plate 450.

Figure 7:
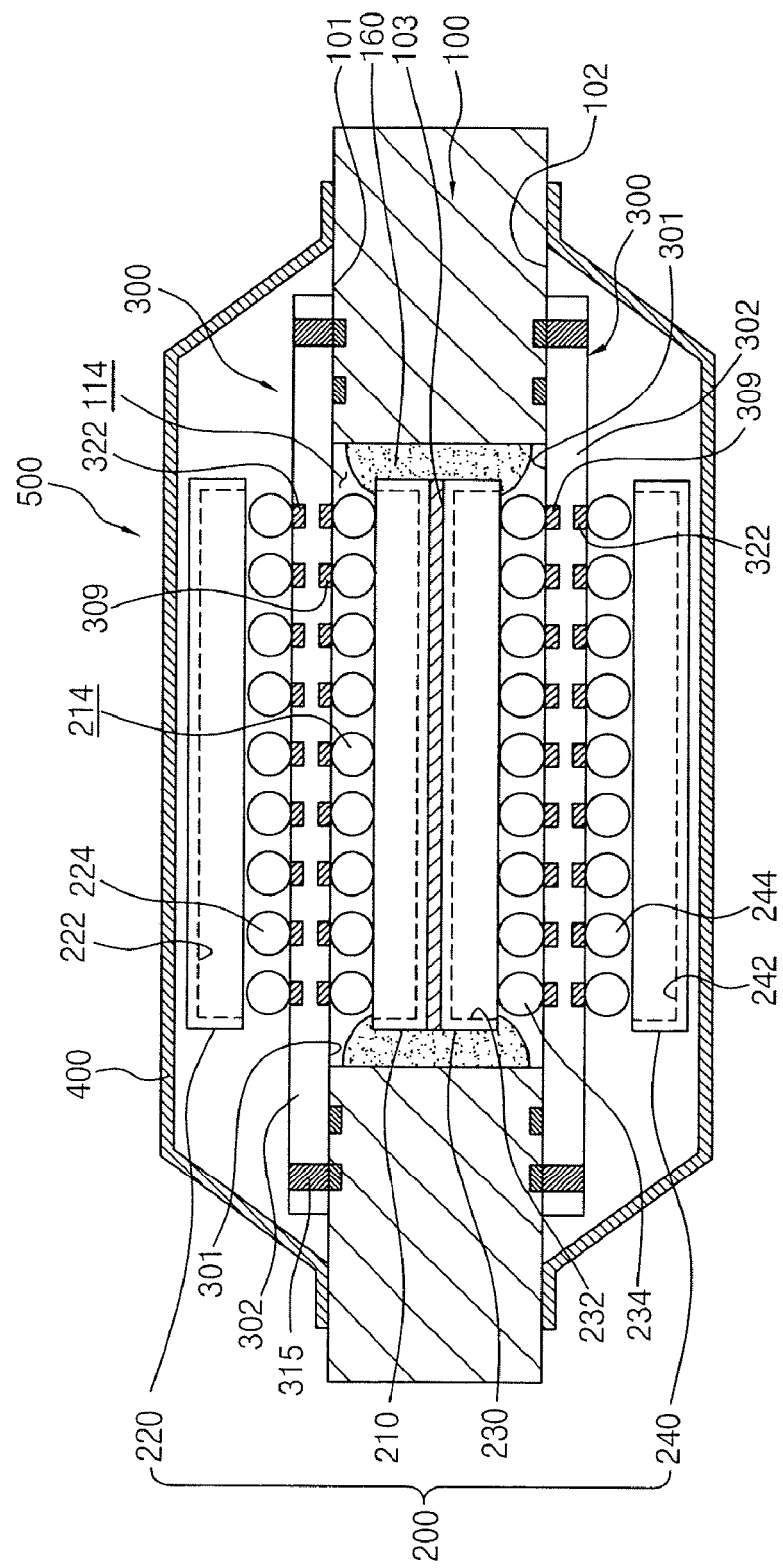
FIG. 7 is a cross-sectional view illustrating a semiconductor package module in accordance with a further embodiment of the present invention.

FIG. 7 is a cross-sectional view illustrating a semiconductor package module in accordance with another embodiment of the present invention. The semiconductor package module in accordance with another embodiment of the present invention has substantially the same components as the semiconductor package module described with reference to FIG. 2, with the exception of the circuit board 100. Therefore, identical parts are denoted by the same reference numbers and a description thereof will not be repeated.

Referring to FIG. 7, the semiconductor package module 500 includes the circuit board 100, the semiconductor package 200, the connection member 300 and the heat dissipating member 400.

The circuit board 100 includes the board body 110 and the conductive pattern 120. In the present embodiment, the circuit board 100 may be, for example, a printed circuit board.

The board body 110 has, for example, a rectangular parallelepiped plate shape. The board body 110 may have a different shape rather than the rectangular parallelepiped plate shape.

The board body 110 has the first surface 101 and the second surface 102 opposite of the first surface 101 and a single receiving portion 114 forming a receiving space is located on the first surface 101 and/or the second surface 102.

The receiving portion 114 is a through hole which passes through the first surface 101 and the second surface 102 of the board body 110. The receiving portion has a shape and size suitable for receiving the semiconductor package 200 when viewed from the top.

The first semiconductor package 210 and the third semiconductor package 230 of the semiconductor packages 200 are received in the receiving portion 114 and the first semiconductor package 210 and the third semiconductor package 230 are adhered to each other by an adhesive.

Meanwhile, in order to prevent the first semiconductor package 210 and the third semiconductor package 230 received in the receiving portion 114 from moving within the receiving portion 114, the first semiconductor package 210 and the third semiconductor package 230 adhered together by the adhesive are strongly fixed by a fixing member 160 formed on the inner surface of the board body 110 formed by the receiving portion 114. The fixing member 160 may be adhesive or elastic.

The first end portion of the conductive patterns 120 shown in FIG. 1 is arranged along the periphery of the receiving part of the board body 110 and the second end portion opposite of the first end portion is electrically connected to the input/output terminal 130 arranged along a longitudinal side of the board body 110.

The semiconductor package module 500 in accordance with the embodiment shown in FIG. 7 is particularly suitable for a relatively thin circuit board 100 as compared to the embodiment of FIG. 2.

Figure 8:
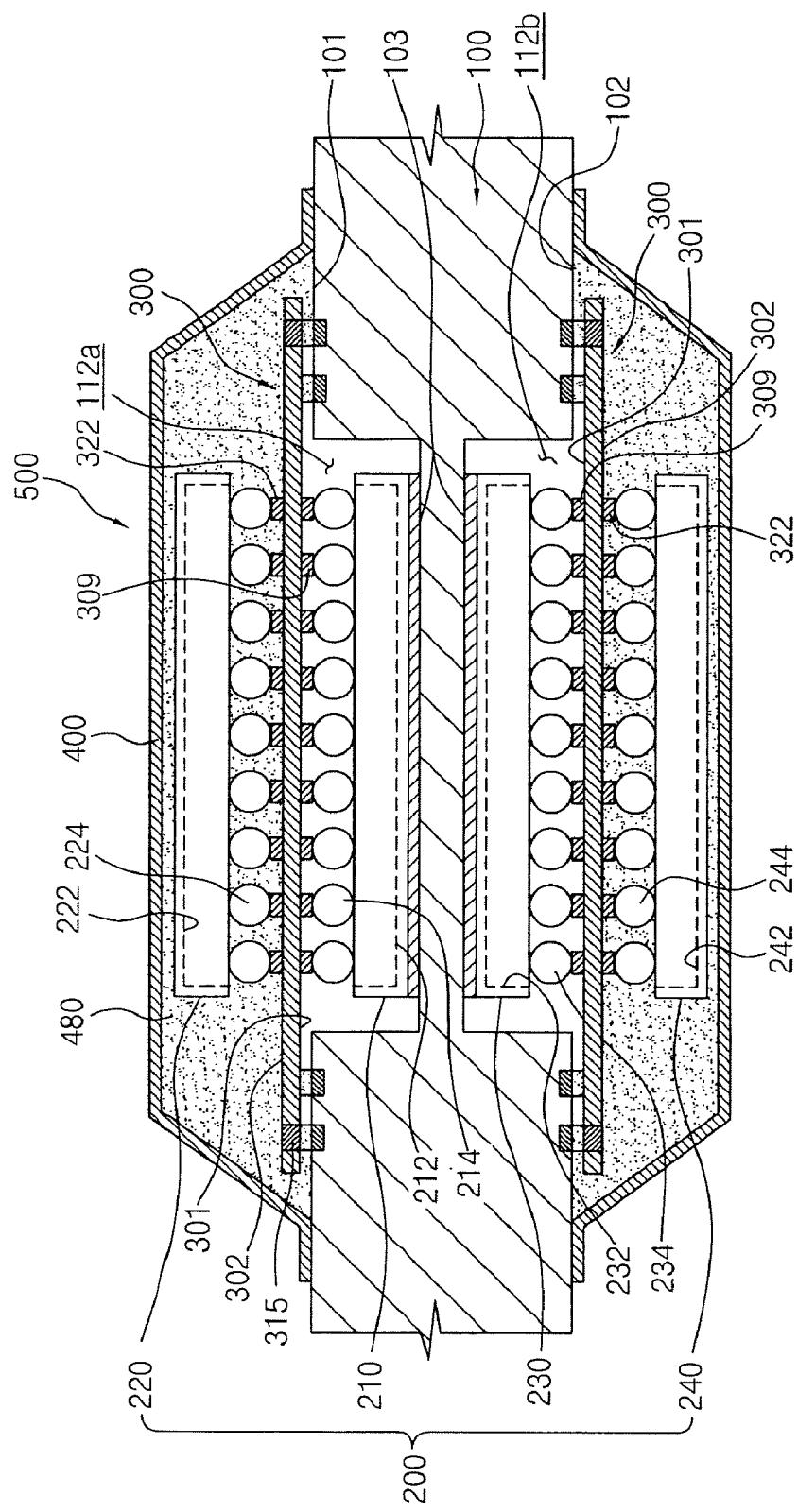
FIG. 8 is a sectional view illustrating a semiconductor package module in accordance with a still further embodiment of the present invention.

FIG. 8 is a cross-sectional view illustrating a semiconductor package module in accordance with a further embodiment of the present invention. The semiconductor package module in accordance with a further embodiment of the present invention has substantially the same components as the semiconductor package module described with reference to FIG. 2 with the addition of a molding member 480. Therefore, identical parts are denoted by the same reference numbers and a description thereof will not be repeated.

Referring to FIG. 8, the semiconductor package module 500 includes the circuit board 100, the semiconductor package 200, the connection member 300, the heat dissipating member 400 and the molding member 480.

The molding member 480 is located, for example, in the space between the heat dissipating member 400 and the connection member 300. In the present embodiment, an example of proper material for the molding member 480 is epoxy resin.

The molding member 480 is located in the space between the heat dissipating member 400 and the connection member 300 and prevents the flexible connection member 300 and the semiconductor package attached to the connection member 300 from being damaged by external impact and/or vibration.

FIG. 9 is a cross-sectional view illustrating a semiconductor package module in accordance with a further embodiment of the present invention. The semiconductor package module in accordance with this further embodiment of the present invention has substantially the same components as the semiconductor package module described with reference to FIG. 2, except for the circuit board. Therefore, identical parts are denoted by the same reference numbers and a description thereof will not be repeated.

Referring to FIG. 9, the semiconductor package module 500 includes the circuit board 190, the semiconductor package 200, the connection member 300 and the heat dissipating member 400.

The circuit board 190 includes a first board body 192, a second board body 194 and a third board body 196. In the present embodiment, the first through third board bodies 192, 194 and 196 may be printed circuit boards.

The first board body 192 is interposed between the second board body 194 and the third board body 196 and the first board body 192 is electrically connected to the second and third board bodies 194 and 196.

The second board body 194 is formed with a through hole. The first board body 192 and the through hole formed in the second board body 194 forms a receiving portion 193 in the second board body 194.

The third board body 196 is also formed with a through hole. The first board body 192 and the through hole formed in the third board body 196 form a receiving portion 195 in the third board body 196.

The connection members 300 are located in the receiving portion 193 formed in the second board body 194 and the receiving portion 195 formed in the third board body 196, and the semiconductor packages 200 are disposed over the connection members 300.

In the present embodiment, when the first board body 192 is very thin, thus creating difficulties in forming a receiving portion suitable to receive the semiconductor package 200 in the first board body 192, the semiconductor packages 200 are received in the receiving portions 193 and 195 respectively formed in the is second and third board bodies 194 and 196 using the circuit board 190 including the second and third board bodies 194 and 196 disposed at both sides of the first board body 192.

In the present invention, although the circuit board and the semiconductor package are connected by the connection member including the insulation member and the first and the second connection patterns, the connection member may be a lead frame including leads connecting the circuit board and the semiconductor package.

As is apparent from the above description, in the present invention, since after a receiving portion having a receiving space is formed in a board body of the circuit board, a semiconductor package is received in the receiving portion, and a connection terminal of the semiconductor package and a conductive pattern of the board body are electrically connected using a connection member, a plurality of semiconductor packages can be stacked in a single circuit board without increasing the thickness, allowing for a significant improvement in the data storage capacity and data processing speed of a semiconductor package module.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package module, comprising:
   a circuit board including a board body having a receiving portion and conductive patterns formed in the board body;
   a semiconductor package received in the receiving portion and having conductive terminals electrically connected to the conductive patterns and a semiconductor chip electrically connected to the conductive terminals;

a connection member for electrically connecting the conductive patterns and the conductive terminals, the connection member being disposed over a surface of the circuit board such that at least a portion of the connection member covers the semiconductor package, wherein the connection member comprises connection patterns formed on a lower surface thereof facing the semiconductor package and the surface of the circuit board, wherein the connection patterns extend so as to electrically connect the conductive terminals of the semiconductor package to first end portions of the conductive patterns formed on the surface of the circuit board facing the connection member;

an external heat dissipating cover coupled to the board body and covering the receiving portion a molding member for molding the semiconductor package and the connection member, the molding member being disposed in a space between the heat dissipating member and the connection member and not within the receiving portion, such that the external heat dissipating cover is disposed on the molding member;

wherein the connection pattern is a first connection pattern, the connection member includes an insulation member and the first connection pattern is formed on the lower surface of the insulation member;

wherein the insulation member includes an upper surface opposite to the lower surface and further includes a second connection pattern formed on the upper surface and electrically connected to the conductive pattern;

wherein the conductive pattern and the first connection pattern and the conductive pattern and the second connection pattern are electrically connected by an anisotropic conductive film (ACF); and wherein the board body includes a heat radiating plate formed to penetrate the board body such that the heat radiating plate is disposed within the board body and radiating heat generated by the semiconductor package to the outside.

2. The semiconductor package module according to claim 1, wherein the receiving portion is a concave recess formed on the surface of the board body, and the connection pattern formed on the lower surface of the connection member connects conductive terminals of the semiconductor package formed within the concave recess to the first end portions of the conductive patterns, which are formed on the surface of the circuit board facing the connection member outside of the recess.

3. The semiconductor package module according to claim 2, wherein the conductive terminals are within the concave recess, and the surface of the board body over which the connection member is formed which is outside of the concave recess is disposed in the same plane as an upper end of the conductive terminals to which the connection patterns of the connection member are electrically connected.

4. The semiconductor package module according to claim 2, wherein the semiconductor package includes a molding member for molding the semiconductor chip, and the molding member is attached to the lower surface of the receiving portion by an adhesive.

5. The semiconductor package module according to claim 2, wherein the receiving portion is a first receiving portion, the semiconductor chip is a first semiconductor chip, and the surface of the circuit body is a first surface, wherein the first receiving portion is disposed over the first surface of the board body, and the semiconductor package module further comprises:

a concave recess formed on a second surface of the circuit board that is opposite to the first surface of the circuit board forming a second receiving portion;

a second semiconductor package received in the second receiving portion and having conductive terminals electrically connected to the conductive patterns and a semiconductor chip electrically connected to the conductive terminals of the second semiconductor package, and a second connection member disposed over the second surface of the circuit board such that at least a portion thereof covers the second semiconductor package.

6. The semiconductor package module according to claim 1, wherein the insulation member includes a flexible board.

7. The semiconductor package module according to claim 1, further comprising a further semiconductor package electrically connected to the second connection pattern.

8. The semiconductor package module according to claim 1, wherein the receiving portion is a through hole passing through the board body and the semiconductor package module further comprises a further semiconductor package formed within the through hole and adhered to the semiconductor package.

9. The semiconductor package module according to claim 1, wherein a portion of the heat radiating plate is projected from the board body and the heat radiating plate projected from the board body includes a plurality of heat dissipation fins arranged on upper and lower surfaces of the heat radiating plate and each extending in a direction perpendicular to the heat radiating plate.

10. The semiconductor package module according to claim 9, wherein a heat conductive adhesive is interposed between the semiconductor package and the heat radiating plate.

11. The semiconductor package module according to claim 1, wherein the board body includes a plate-shaped first board body and second board bodies disposed at both sides of the first board body and having a through portion which exposes the first board body thereby forming the receiving portion; and the conductive patterns are located on the surface of the second board bodies.

12. The semiconductor package module according to claim 11, wherein the first board body has a first length and the second board body has a second length shorter than the first length.

13. The semiconductor package module according to claim 1, wherein the connection member is a lead frame.

14. The semiconductor package module according to claim 1, further comprising a fixing member interposed between a sidewall of the semiconductor chip and an inner surface of the board body that is opposite to the sidewall so as to fix the semiconductor chip to the inner surface of the board body.

15. The semiconductor package module according to claim 14, wherein the fixing member includes adhesive or elastic.

16. The semiconductor package module according to claim 1, wherein the conducive terminals are formed on an upper surface of the semiconductor chip, and the connection patterns comprise connection terminals, ball land patterns, and conductive patterns connecting the connection terminals to the ball land patterns, wherein the ball land patterns are disposed on a portion of the lower surface of the connection member covering the semiconductor chip so as to be electrically connected to conductive terminals formed on an upper surface of the semiconductor chip, and wherein the connection terminals are arranged along a periphery of the receiving part of the board body and are electrically connected to the first end portions of the conductive patterns of the circuit board.

17. A semiconductor package module, comprising:
a circuit board including a board body having a receiving portion and conductive patterns formed in the board body, wherein the board body is a single layer in which the receiving portion only partially penetrates;
a semiconductor package received in the receiving portion and having conductive terminals electrically connected to the conductive patterns and a semiconductor chip electrically connected to the conductive terminals;
a connection member for electrically connecting the conductive patterns and the conductive terminals, the connection member being disposed over a surface of the circuit board such that at least a portion of the connection member covers the semiconductor package, wherein the connection member comprises connection patterns formed on a lower surface thereof facing the semiconductor package and the surface of the circuit board, wherein the connection patterns extend so as to electrically connect the conductive terminals of the semiconductor package to first end portions of the conductive patterns formed on the surface of the circuit board facing the connection member;
an external heat dissipating cover coupled to the board body and covering the receiving portion;
a molding member for molding the semiconductor package and the connection member, the molding member being disposed in a space between the heat dissipating member and the connection member and not within the receiving portion, such that the external heat dissipating cover is disposed on the molding member;
wherein the connection pattern is a first connection pattern, the connection member includes an insulation member and the first connection pattern is formed on the lower surface of the insulation member; and
wherein the insulation member includes an upper surface opposite to the lower surface and further includes a second connection pattern formed on the upper surface and electrically connected to the conductive pattern.

18. The semiconductor package module according to claim 17, wherein the receiving portion is a first receiving portion penetrating a first surface of the board body, and the board body further comprises a second receiving portion only partially penetrating a second surface of the board body opposite the first surface, the semiconductor package module further comprising:
a second semiconductor package received in the second receiving portion and having conductive terminals electrically connected to second conductive patterns formed on the board body;
a second connection member for electrically connecting the conductive patterns and the conductive terminals, the connection member being disposed over the second surface of the circuit board such that at least a portion of the second connection member covers the second semiconductor package, wherein the second connection member comprises second connection patterns formed on an upper surface thereof facing the second semiconductor package and the second surface of the circuit board, wherein the second connection patterns extend so as to electrically connect the second conductive terminals of the second semiconductor package to first end portions of the second conductive patterns formed on the second surface of the circuit board facing the second connection member.

* * * * *